United States Patent
Endreß et al.

(10) Patent No.: US 12,097,575 B2
(45) Date of Patent: Sep. 24, 2024

(54) SOLDERING APPARATUS

(71) Applicant: ERSA GmbH, Wertheim (DE)

(72) Inventors: Lothar Endreß, Wertheim (DE);
Benedict Fleischmann, Neubrunn (DE); Lukas Thanhäuser, Würzburg (DE)

(73) Assignee: ERSA GmbH, Wertheim (DE)

( * ) Notice: Subject to any disclaimer, the term of this patent is extended or adjusted under 35 U.S.C. 154(b) by 91 days.

(21) Appl. No.: 17/983,061

(22) Filed: Nov. 8, 2022

(65) Prior Publication Data

US 2023/0147071 A1     May 11, 2023

(30) Foreign Application Priority Data

Nov. 9, 2021  (DE) .................... 10 2021 129 129.1

(51) Int. Cl.
  *B23K 3/00*     (2006.01)
  *B23K 1/00*     (2006.01)
  (Continued)

(52) U.S. Cl.
  CPC ............ *B23K 3/085* (2013.01); *B23K 1/0016* (2013.01); *H05K 3/10* (2013.01); *B23K 2101/42* (2018.08);
  (Continued)

(58) Field of Classification Search
  CPC .......... B23K 1/008; B23K 1/012; B23K 3/08; F27B 9/24; F27B 9/3077; H01L 21/67109; H01L 21/67173; H01L 21/6776
  See application file for complete search history.

(56) References Cited

U.S. PATENT DOCUMENTS 5,289,968 A * 3/1994 Maeda ..................... B23K 1/19
                                                    228/262.5
5,433,368 A * 7/1995 Spigarelli ............. B23K 1/012
                                                    219/390
(Continued)

FOREIGN PATENT DOCUMENTS

CN          1420979 A      5/2003
CN        201483122 U      5/2010
(Continued)

OTHER PUBLICATIONS

German Office Communication, dated Dec. 5, 2022, App No. 102021129129.1, pp. 1-4.
(Continued)

*Primary Examiner* — Erin B Saad
(74) *Attorney, Agent, or Firm* — BOND, SCHOENECK & KING, PLLC; George R. McGuire

(57) ABSTRACT

A soldering apparatus, in particular a reflow soldering apparatus, for the continuous soldering of printed circuit boards along a transport direction, including a process channel that has a preheating zone, a soldering zone and a cooling zone, and further includes a base body and a cover hood movable between a closed position and an open position, wherein nozzle plates, fan units with fan motors, air ducts that conduct the process gas, filter elements and/or cooling elements are provided in the base body. The soldering apparatus further includes a drawer, which extends along a pull-out direction running transversely to the transport direction, is provided in the base body, with a bottom, a front wall and a rear side. Air ducts for conducting the process gas, at least one replaceable filter element in a filter region and at least one cooling device are provided in the drawer.

14 Claims, 6 Drawing Sheets

(51) Int. Cl.
*B23K 3/08* (2006.01)
*H05K 3/10* (2006.01)
*B23K 101/42* (2006.01)

(52) U.S. Cl.
CPC ............... *H05K 2203/1509* (2013.01); *H05K 2203/1545* (2013.01)

(56) References Cited

U.S. PATENT DOCUMENTS

| | | | | |
|---|---|---|---|---|
| 5,440,101 | A * | 8/1995 | Cox | H05K 13/02 34/212 |
| 5,454,507 | A * | 10/1995 | Tanaka | B23K 1/008 228/221 |
| 5,481,087 | A * | 1/1996 | Willemen | B23K 1/008 219/400 |
| 6,084,214 | A * | 7/2000 | Tallman | B23K 1/012 219/400 |
| 6,501,051 | B1 * | 12/2002 | Richert | H01L 21/6776 228/180.1 |
| 2001/0030184 | A1 * | 10/2001 | Richert | H01L 21/67115 219/413 |
| 2002/0146657 | A1 * | 10/2002 | Anderson | B23K 1/008 432/121 |
| 2011/0247202 | A1 * | 10/2011 | Inoue | B23K 3/0475 29/705 |
| 2015/0208515 | A1 * | 7/2015 | Dautenhahn | H05K 3/306 228/6.2 |
| 2015/0245499 | A1 * | 8/2015 | Dautenhahn | B23K 3/082 228/37 |
| 2016/0339486 | A1 * | 11/2016 | Blair | B08B 7/0014 |

FOREIGN PATENT DOCUMENTS

| | | |
|---|---|---|
| CN | 201895157 U | 7/2011 |
| CN | 108237292 A | 7/2018 |
| CN | 108237296 A | 7/2018 |
| CN | 110465156 A | 11/2019 |
| CN | 210280990 U | 4/2020 |
| DE | 1976899 U | 1/1968 |
| DE | 10 2005 055 283 A1 | 5/2007 |
| DE | 10 2019 125 981 A1 | 4/2021 |
| DE | 10 2019 128 780 A1 | 4/2021 |
| EP | 3482861 A1 | 5/2019 |

OTHER PUBLICATIONS

Translated Chinese Office Action, App. No. 202211389243.X, dated May 18, 2024, pp. 1-11.

* cited by examiner

SOLDERING APPARATUS

CROSS REFERENCE TO RELATED APPLICATION

The present application relates and claims priority to German Patent Application No. 10 2021 129 129.1, filed Nov. 9, 2021, the entirety of which is hereby incorporated by reference.

BACKGROUND

The invention relates to a soldering apparatus, in particular a reflow soldering apparatus, for the continuous soldering of printed circuit boards along a transport direction, comprising a process channel comprising a preheating zone, a soldering zone and/or a cooling zone, having a base body and a cover hood, wherein the cover hood is displaceable between a closed position and an open position, wherein nozzle plates, fan units, air ducts conducting the process gas, filter elements and/or cooling elements are provided in the base body.

By means of reflow soldering apparatus, so-called SMD components (surface-mounted devices) are soldered onto the surface of printed circuit boards by means of solder paste. The solder paste, which is in particular a mixture of solder metal granules, flux and pasty components, is applied to or printed onto the surface of the printed circuit boards for reflow soldering. The components to be soldered are then planted into the solder paste. In the reflow soldering process, the material for soldering, i.e. the assembly consisting of printed circuit board, solder paste and the components to be soldered, are preheated in a preheating zone along the process channel and in a soldering zone heated to a temperature above the melting point of the solder paste. As a result, the solder paste melts and the solder joints are formed. In a cooling zone, if one is present, the material for soldering is cooled until the melted solder solidifies before said material is removed from the reflow soldering apparatus.

Soldering apparatus for the continuous soldering of printed circuit boards are known from DE 10 2019 128 780 A1, DE 10 2019 125 981 A1 and DE 10 2005 055 283 A1.

In the case of reflow soldering apparatus, the process channel is generally formed by two channel halves, an upper and a lower channel half. The lower channel half is provided in or on the base body and the upper channel half is provided in or on the cover hood. Further components, such as, for example, nozzle plates, fan units, air ducts conducting the process gas, filter elements and/or cooling elements, are generally provided in or on the process channel or in or on the base body and in or on the cover hood. Overall, a desired temperature profile is thus provided in the process channel along the transport direction, wherein the process gas is blown into the process channel, sucked out of said channel, in particular cooled in the cooling zone, cleaned and fed back to the process channel.

In particular in the cooling zone, condensate forms during the cooling of the process gas, which can lead to contamination of the machine.

SUMMARY OF THE INVENTION

The object of the invention is to provide a soldering apparatus with which, in particular, the cooling zone is advantageously designed such that impurities are prevented and/or individual components are easily accessible in particular in the base body.

This object is achieved by means of a soldering apparatus. Consequently, in particular in the cooling zone, it is provided that a drawer that can be pulled out along a pull-out direction running transversely to the transport direction is provided in the base body, said drawer having a bottom, a front wall and a rear side, which can in particular be formed by a rear wall or comprise a rear wall, wherein air ducts for conducting the process gas, at least one replaceable filter element and/or at least one cooling device are provided in the drawer.

By providing the drawer that can be pulled out transversely to the transport direction and in particular in the vertical direction, the at least one replaceable filter element and/or the cooling device that is provided in the drawer are consequently easily accessible. Since moisture or vapors contained on the cooling device in the process gas condense, by providing the drawer, it is particularly advantageous to collect the condensate in the drawer and, if necessary, to ultimately remove it by opening the drawer. Furthermore, the provision of the drawer is advantageous in order to visually check and/or replace the filter element. An exchange of the filter element when the drawer is open is comparatively easy to accomplish.

Furthermore, it is advantageous if air ducts are formed and arranged in the base body in such a way that the process gas is conducted out of the process channel vertically downwards into an entry channel provided on the front wall of the drawer, wherein the entry channel is deflected in the region of the bottom of the drawer towards a cooling device comprising a cooling plate. The cooling plate preferably extends at least in sections along the bottom of the drawer. The described manner of conducting the process gas makes it possible to ensure that the moisture and vapors present in the process gas condense on the cooling plate on the bottom of the drawer. This has the advantage that the condensate collects at the bottom of the drawer. The cooling plate has dimensions that are suitable for adequately condensing vapors present in the process gas. The cooling plate can be actively cooled, for example by means of energizable cooling elements. The cooling plate can also be arranged such that it is cooled by the ambient atmosphere.

The entry channel extending over the bottom of the drawer is advantageously designed such that it opens into a filter region on the side facing the rear side, in which filter region the at least one filter element is provided. This causes process gas, which has cooled sufficiently, to flow out into the filter region and to be able to flow through the filter element there. Since vapors in the process gas have already condensed out on the cooling element, process gas that is at least somewhat dehumidified flows through the filter element.

For the targeted movement of the process gas in the base body, a plurality of fan units is preferably provided, wherein at least one shielding plate is provided in the upper region of the drawer that shields an intake region of at least one fan unit towards the filter region. This ensures that process gas does not flow directly from the filter element to the fan unit via the fan units, but is deflected via the shielding plates.

Furthermore, it is advantageous if the cooling plate extends along a cooling plane running obliquely to the horizontal and having a drip pan in its region located vertically below. It is advantageous if the drip pan is provided in or on the bottom of the drawer in the region of the front wall. As a result, liquid condensing on the cooling plate and following the slope of the cooling plate can be collected in the drip pan. Furthermore, the drip pan is in particular transparent, so that whether and how much condensate is present in the drip pan can be checked visually. Furthermore, the drip pan is preferably detachably arranged on the drawer, so that emptying the drip pan is possible without opening the drawer.

Furthermore, it is advantageous if the filter element in the drawer runs obliquely to the horizontal and in particular in the region of a diagonal of the drawer and thus along a filter plane running obliquely to the horizontal. Due to the oblique arrangement of the filter plane, its surface can be enlarged as compared with a horizontal arrangement, thereby increasing the filter capacity. The filter element can comprise a filter grate and a filter fleece provided in or on the filter grate.

Such an arrangement is then particularly advantageous in that the shielding plate covers that part of the filter element that is close to the bottom of the drawer or in which the filter element is located in the lower region of the drawer. Seen from above, the shielding plate, which in particular extends in the horizontal direction, then covers in particular approximately half of the filter element. The arrangement is preferably such that the cover plate is provided in the rear region of the drawer, i.e. in particular adjoining the rear side.

It is particularly advantageous if the cooling plane and the filter plane enclose an acute angle. This results in optimized air guidance and overall an optimized cooling result and filtration result of the process gas. The shielding plate then preferably lies above the region where the acute angle between the filter element and the cooling plate is located.

It is also conceivable for the drawer to have two, three or more compartments lying next to one another in the pull-out direction, wherein a filter element is provided in each of the compartments. Furthermore, each compartment can be provided with its own entry channel and own shielding plate. As a result, the one drawer turn out very wide, wherein a plurality of air circuits running substantially parallel and transverse to the transport direction can be provided within the drawer by the individual compartments and thus a uniform distribution of the air flow be provided.

Furthermore, it is advantageous if a collecting tray is provided beneath the drawer on the base body, which collecting tray serves to collect condensate dripping down or contaminants dropping down when the drawer is open. This ensures that the substrate beneath the soldering apparatus does not get dirtied even when the drawer is open.

Furthermore, it is advantageous if a lowering mechanism is provided for lowering the drawer before the drawer is pulled out or as the drawer is being pulled out. Such a lowering mechanism can provide, for example, a lever mechanism by means of which the drawer is lowered as the drawer is being pulled out. This has the advantage that a comparatively snug abutment can be achieved between the drawer and the process channel. This prevents process gas from flowing out between the drawer and the base body when the drawer is closed and lifted.

Furthermore, an advantageous embodiment of the invention provides that, in or on the base body, at least one fan unit located on the face of the rear side facing away from the front wall, i.e. in the pull-out direction behind the rear side—and in the transport direction laterally next to the process channel—is provided. The provision of the at least one fan unit in the transport direction laterally next to the process channel, and not in the vertical direction below the process channel, has the advantage that the soldering apparatus has a lower overall height, the process channel can be arranged correspondingly lower and the fan units are easily accessible for repair and maintenance. In addition, a better heat dissipation of the heat generated by the fan units is possible, since the heat generated by the fan units can be discharged laterally next to the process channel. The cooling of the fan motors is thereby improved and the service life of the fan motors is increased. Nevertheless, a closed air circuit that runs substantially transversely to the transport direction can be provided.

It is advantageous if the at least one fan unit is arranged not only laterally next to the process channel, but also in a plane below the process channel and that air ducts are arranged and provided such that, during operation of the at least one fan unit, process gas is blown by the at least one fan unit to laterally below the process channel and is deflected there vertically upwards into the process channel. Precisely by the preferably several fan units being provided on the one hand next to the process channel and in addition below the process channel as well, air can be guided substantially in a straight line along a plane up to and into the region below the process channel.

Furthermore, it is advantageous if air ducts are provided in such a way that, during operation of the at least one fan unit, process gas is blown into the process channel, that the process gas after passage through the process channel is passed through the filter element and that the filtered process gas is sucked in by the at least one fan unit. This results in a closed circuit that runs substantially transversely to the transport direction. Here, the process gas runs through regions provided on the base body and also regions inside the drawer.

Thereby, it is further advantageous if, during operation of the at least one fan unit, process gas in the cooling zone is blown into the process channel such that the material for soldering is blown at from below.

BRIEF DESCRIPTION OF THE DRAWINGS

Further details and advantageous embodiments of the invention can be found in the following description, on the basis of which an exemplary embodiment of the invention is described and explained in more detail.

The drawings show.

DETAILED DESCRIPTION

Figure 1:
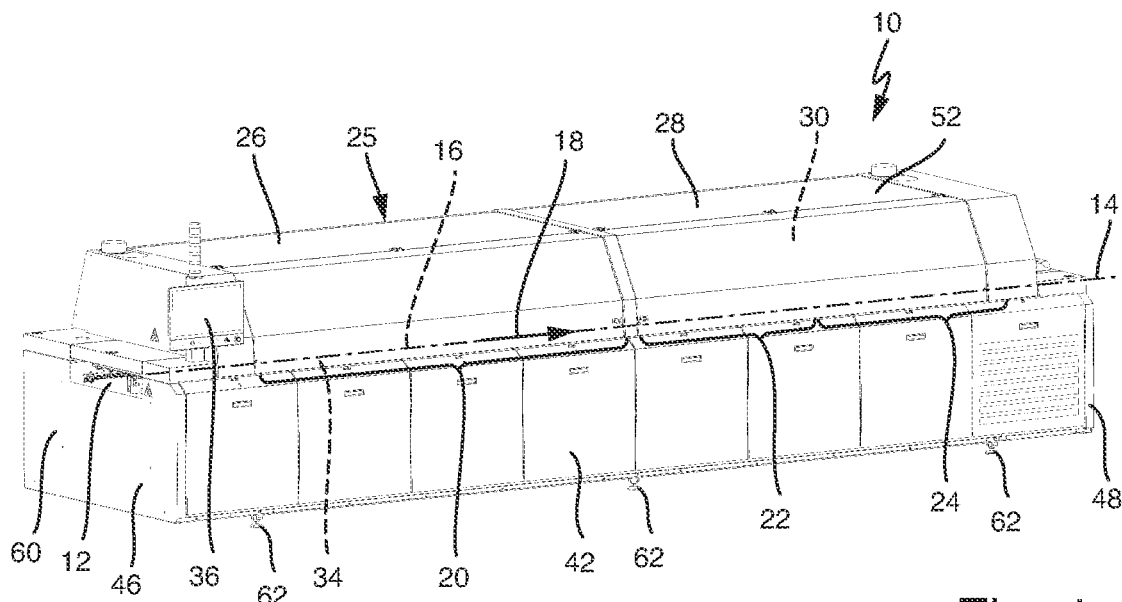
FIG. 1 a reflow soldering apparatus in a side view obliquely from the front with closed cover hood.

FIG. 1 shows a reflow soldering apparatus 10 for the continuous soldering of material for soldering. The reflow soldering apparatus 10 has an entry 12 and an exit 14, wherein the material for soldering reaches the reflow soldering apparatus 12 via the entry 10 and is discharged from the reflow soldering apparatus 14 via the exit 10. The material to be soldered is transported along a transport direction 18 through a process channel 16 indicated in FIG. 1. A preheating zone 20, a soldering zone 22 and a cooling zone 24 are provided in the process channel 16.

Figure 2:
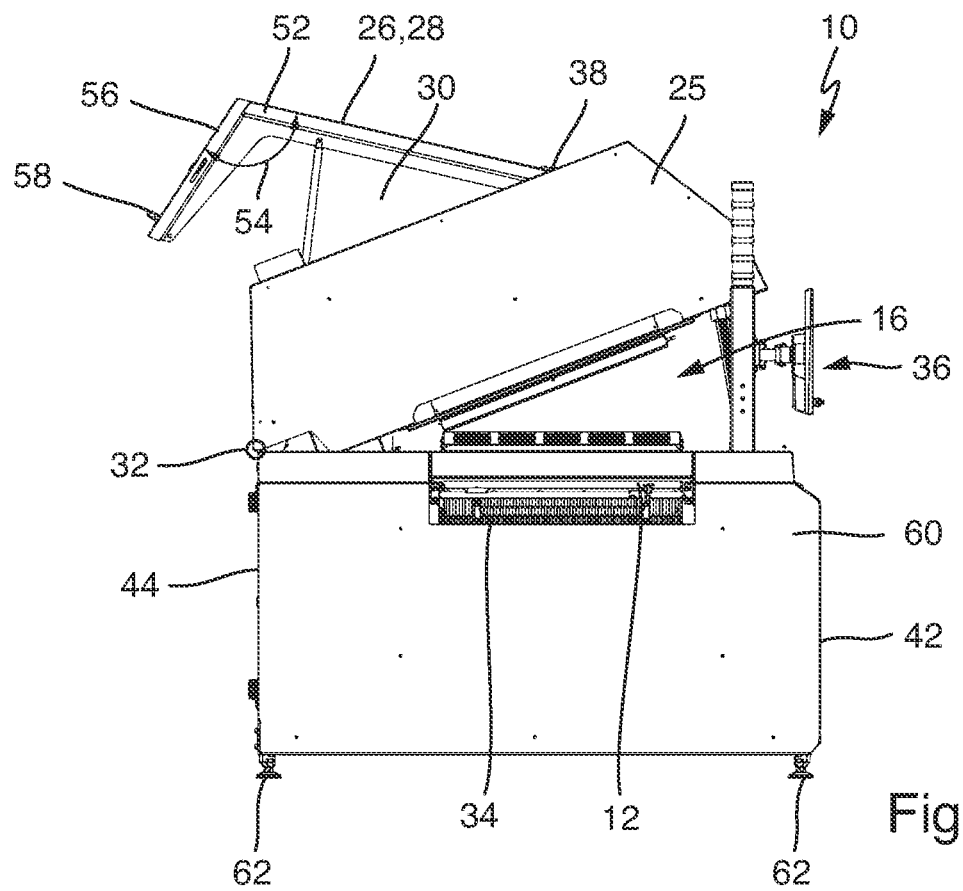
FIG. 2 the reflow soldering apparatus according to FIG. 1 in front view with an open covering hood and opened hood flaps.

As is clear from FIGS. 1 and 2, a communications unit 36 is provided with a display screen and an input device, by means of which it is possible to communicate with a machine controller of the reflow soldering apparatus 10.

The material to be soldered, that is to say the printed circuit board provided with solder paste and populated with electronic components, is first heated in the preheating zone 20 to a temperature that is below the melting temperature of the solder paste. In the soldering zone 22, the printed circuit board is heated for a certain time to a process temperature that lies above the melting point of the solder paste, so that this melts in the soldering zone in order to solder the electronic components to the printed circuit board. In the cooling zone 24, the material to be soldered is cooled so that the liquid solder solidifies before the material to be soldered is removed at the exit 14 of the reflow soldering apparatus 10.

A transport system 34 is provided within the reflow soldering apparatus 10 for transporting the printed circuit boards along the transport direction 18.

As is clear from FIG. 2, the reflow soldering apparatus 10 has a cover hood 25 with two hood flaps 26, 28. The cover hood 25 can be pivoted open about a hood axis 32 extending parallel to the transport direction 18. By the cover hood 25 pivoting, the interior of the process channel 16 and the transport system 34 become accessible so that they can be checked visually, maintained, cleaned, set up, replaced and, if necessary, repaired.

As is further apparent from FIG. 2, the hood flaps 26, 28 can be pivoted open about a flap axis 38 running parallel to the hood axis 32. By the hood flaps 26, 28 pivoting upward, the hood compartment 30 above the process channel and thus lying above the upper channel half, in which compartment fan modules, heating elements and air ducts are provided, becomes accessible. The flap axis 38 is arranged above the hood axis 32, namely not only when the cover hood 25 is open, but also when the cover hood 25 is closed.

The soldering apparatus 10 has two longitudinal sides 42 and 44 and two narrow sides 46 and 48. As can be clearly seen in FIG. 2, the hood axis 32 is located in the region of the one rear longitudinal side 44. In contrast, the flap axis 38 is located in the region of the front longitudinal side 42, or is closer to the front longitudinal side 42 than to the rear longitudinal side 44.

Figure 3:
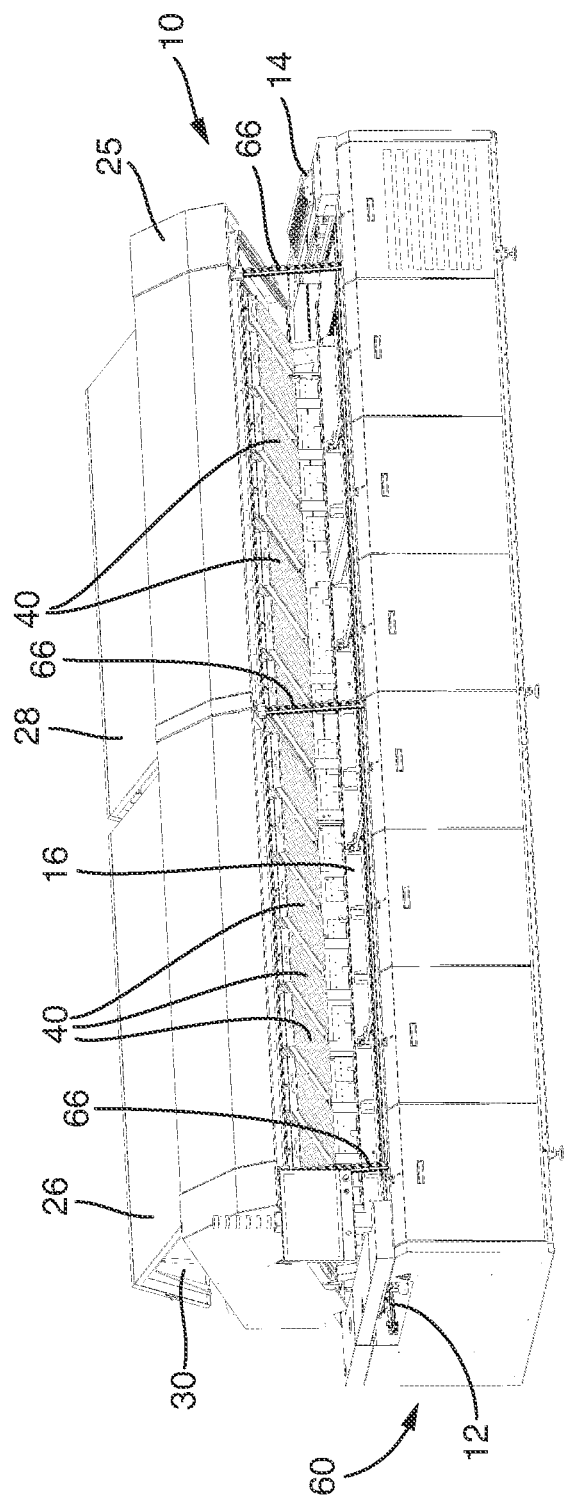
FIG. 3 the reflow soldering apparatus according to FIG. 1 from obliquely to the front with an open cover hood and opened hood flaps.

In FIG. 3, in which on the one hand the cover hood 25 and on the other hand the hood flaps 26, 28 are open, the open process channel 16 can be seen in particular. The process channel 16 is formed by two channel halves, an upper channel half and a lower channel half. The lower channel half with the lower nozzle plates 118 is provided in or on a base body 60 and the upper channel half with the upper nozzle plates 40 is provided in or on the cover hood 25. The upper channel half and the upper nozzle plates 40 and further components located in the hood chamber 30 are arranged on the cover hood 25 such that they are pivoted open as the cover hood 25 is opened and the process channel 16 is released.

Figure 4:
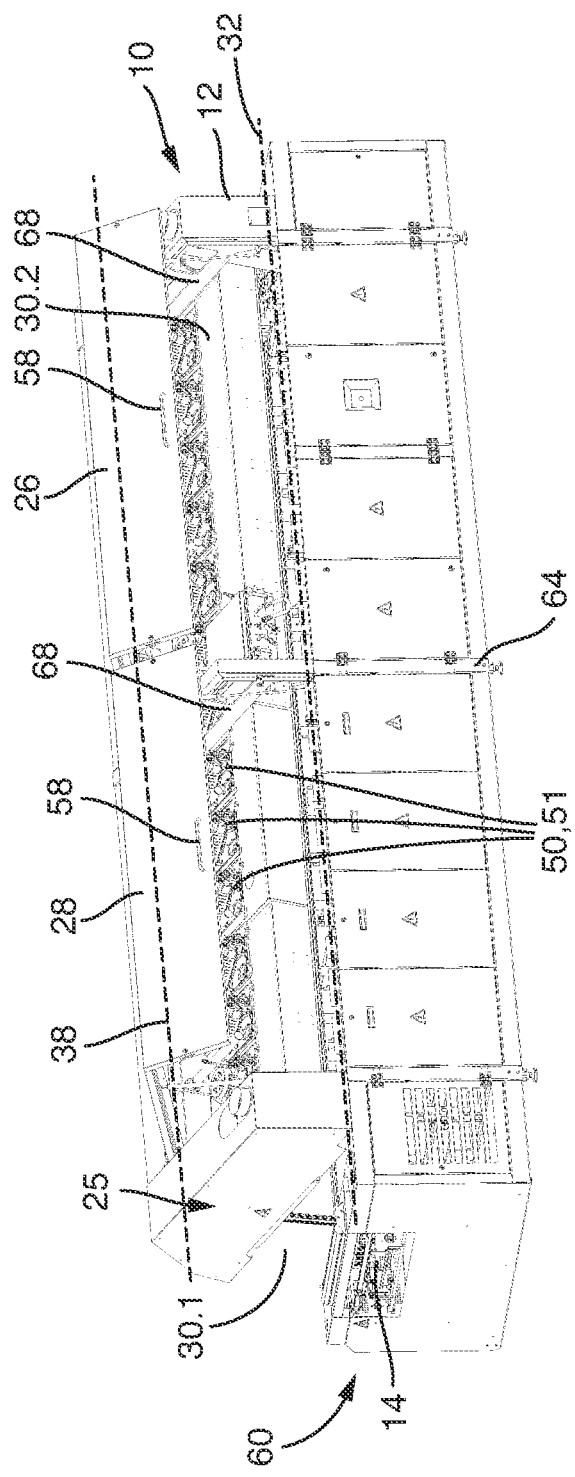
FIG. 4 the reflow soldering apparatus according to FIG. 1 from obliquely to the rear with an open cover hood and opened hood flaps.

Such an arrangement ensures that, as is clear from FIGS. 2 to 4, when the cover hood 25 is open, the process channel 16 is accessible from the front longitudinal side 42, and that the upper hood compartment 30 covered by the hood flaps 26, 28 is accessible from the other rear longitudinal side 44. Among other things, this has the advantage that, when the cover hood 25 is being opened, and thus when the process channel 16 is being uncovered, gas flowing out of the process channel 16 does not flow into the upper hood compartment 30 covered by the cover flaps 26, 28. Furthermore, a plurality of operators can monitor or maintain the process channel 16 at the same time and independently thereof the hood compartment 30 covered by the cover flaps 26, 28.

Figure 5:
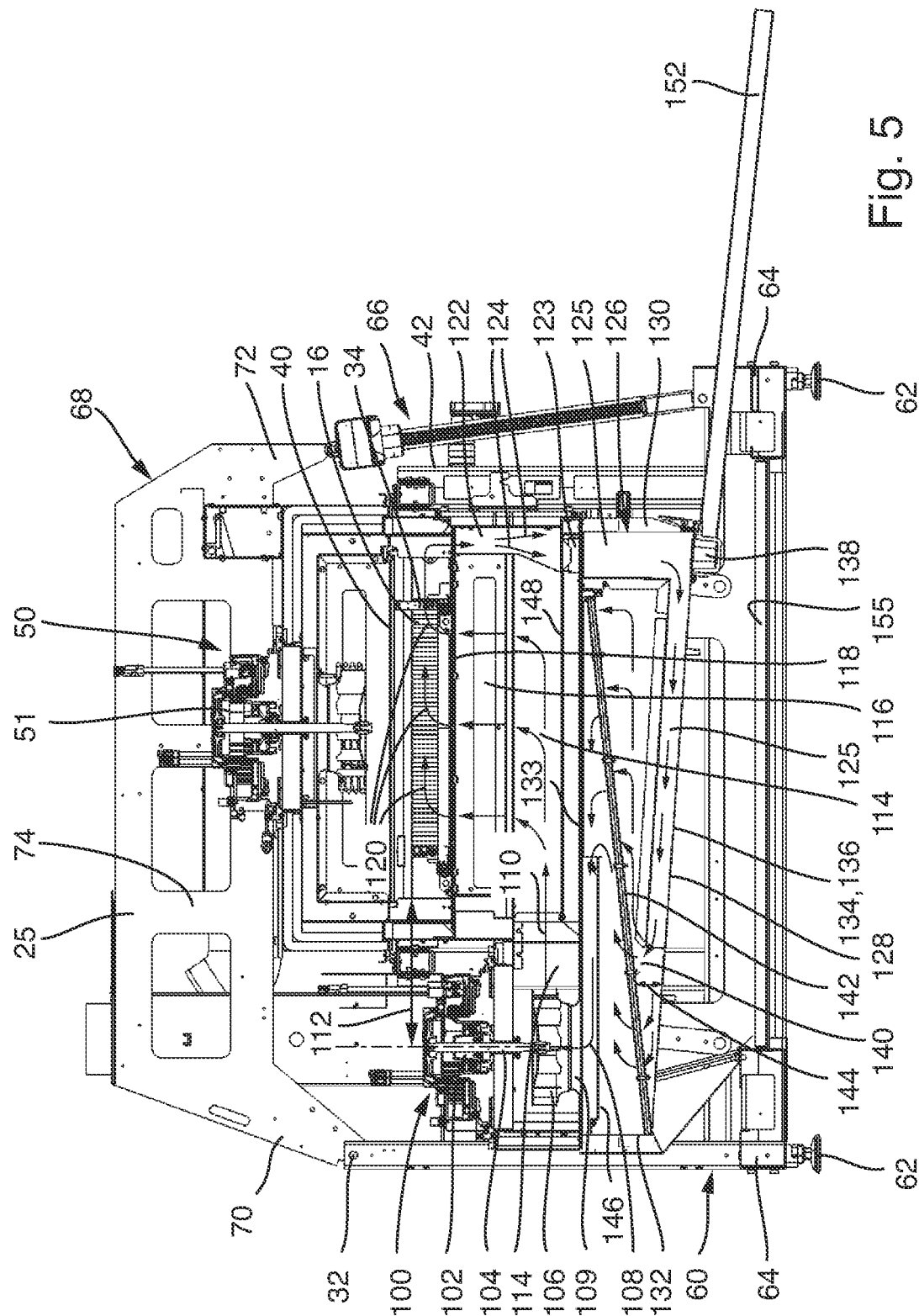
FIG. 5 a cross-section through the cooling zone of the reflow soldering apparatus according to FIG. 1 without machine panels with drawer closed.

As is clear from FIGS. 4 and 5, a plurality of fan units 50 with fan motors 51 is located above the upper channel half in the hood chamber 30 covered by the hood flaps 26, 28, said fan motors being provided for generating an intended air flow in the process channel 16. The fan units 50 in the preheating zone 20 and in the process zone 22 can additionally have heating elements in order to provide a prespecified temperature. By means of the fan units 50 or the fan motors 51 thereof, correspondingly heated or cooled process gas as well is introduced from above through the nozzle plates 40 into the process channel 16 and then sucked in again via the longitudinal sides of the process channel 16.

If the cover hood 25 is opened, the process channel 16 and the transport system provided therein will therefore in particular be accessible. If the hood flaps 26, 28 are opened up, in particular the fan units 50 provided therein will be accessible together their possibly provided heating elements and likewise the air ducts provided there.

In their closed position, which is shown in FIG. 1, the two hood flaps 26, 28 have a horizontal section 52, which is located close to the flap axis 38 and extends substantially in the horizontal direction. This horizontal section 52 is adjoined by a sloping section 56, which is remote from the flap axis 38 and which with the horizontal section 52 encloses an obtuse angle 54. As is clear in particular from FIG. 4, handles 58 for opening the two hood flaps 26, 28 are provided on the sloping section. The obtuse angle 54 can in particular be clearly seen in FIG. 2.

The base body 60 stands on a substrate by means of feet 62. The feet 62 are provided on a lower frame 64. Furthermore, drive units 66 are provided for the motorized opening and closing of the cover hood 25, which are braced at one end on the lower frame 64 and at the other end on the cover hood 25. As is also clear from FIG. 5, which shows the cover hood 25 without its panels, the cover hood 25 comprises portal-like frame arms 68, each of which has a first support section 70 directed towards the hood axis 32 and a second support section 72 directed toward the respective drive unit 66. A central section 74 is provided between the two support sections 72.

As is clear from the section according to FIG. 5 through the cooling zone 24, a plurality of fan units 100 arranged one after the other in the transport direction 18 is provided in the base body 60 in the transport direction 18 laterally next to the process channel 16 and in a plane below the transport channel 18, wherein in each case only one fan unit 100 can be seen in the section according to FIGS. 5 and 6. The fan units 100 correspond in structure to the fan units 50 and, as is clear from FIGS. 5 and 6, lie in the transverse direction between the hood axis 32 and the process channel 16.

The fan units 100 each have a fan motor 102, a rotor shaft 104 driven by the fan motor 102 and a fan impeller 106 provided on the rotor shaft 104. The respective fan impeller 106 is a radial fan impeller that in FIG. 5 from a intake region 109 sucks in process gas 108 axially from below and blows the process gas 110 away in the radial direction. Thereby, as is clear from FIG. 5, the respective rotor shaft 104 is laterally spaced apart from the process channel 16 in the horizontal direction by the dimension 112. The respective rotor shaft 104 runs in the vertical direction. Thereby, the arrangement is such that the respective fan motor 102 sits vertically above the respective fan impeller 106.

During operation of the fan units 100, process gas 110 is blown into a guide channel 114 that extends substantially horizontally and at the fan impeller 106 then runs in transverse direction extending transversely to the transport direction 18 initially laterally next to and subsequently perpendicular to the process channel 16. Via the guide channel 114, the process gas is then blown vertically upwards through a cooling element in the form of a heat exchanger 116, in which the process gas is cooled further, and is blown into the process channel 16 from below through a lower nozzle plate 118. Consequently, the material for soldering that is to be cooled is blown onto from below within the cooling zone 24.

The process gas 120 being blown in is conducted towards the front longitudinal side 42 onto the material for soldering provided in the process channel 14. The process gas 124 there enters a feed duct 122 and is guided vertically downwards. In the region 123, the feed duct 122, which is provided on the base body 60, merges into an entry channel 125, which is provided in a drawer 126. The drawer 126 is shown in the closed state in FIG. 5 and in the open state in FIG. 6. The drawer 126 is also shown as an individual part in FIGS. 8 and 9. The drawer 126 is accessible from the front side 42 of the base body 60. On the front side of the base body 60 shown in FIG. 3, openable doors are provided, behind which the drawer 126 is provided.

The drawer 126 provides a base 128, a front wall 130 and a rear side in the form of a rear wall 132. The drawer 126 also has an upper edge 133, which is designed running horizontally. In the region of the bottom 128, the entry channel 125 deflects process gas towards a cooling device 136 formed as a cooling plate 134.

Figure 6:
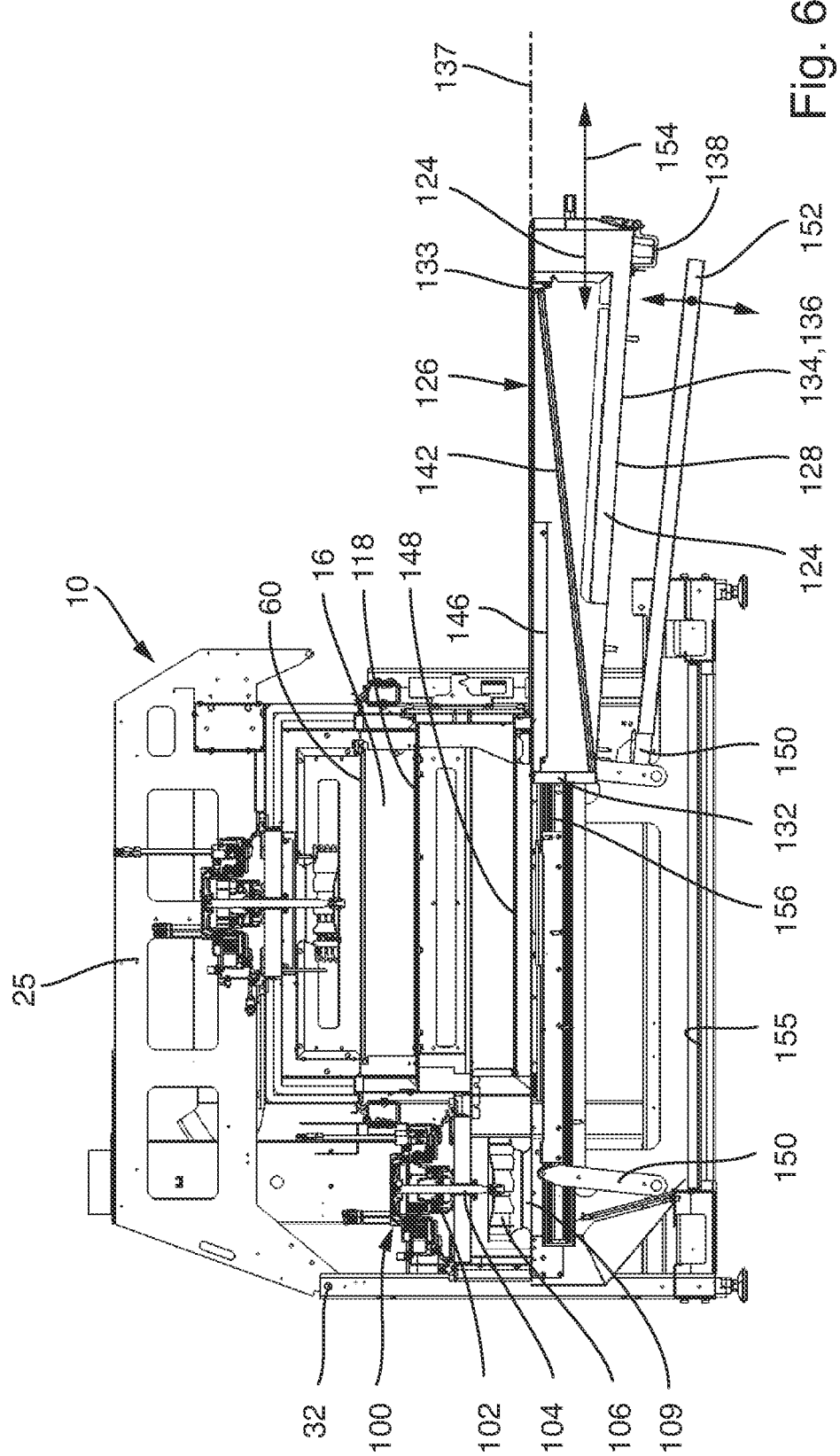
FIG. 6 a cross-section through the reflow soldering apparatus according to FIG. 1 with drawer open.

As is clear in particular from FIGS. 5 and 6, the cooling plate 134 runs obliquely to the upper edge 133 or to the horizontal 137 and declines to the front, that is to say towards the front longitudinal side 42 or to the front wall 130 of the drawer 126. In the region of the front wall 130, a removable drip pan 138 is provided on the bottom 128 of the drawer 126. Condensate, which condenses on the cooling plate 134, collects in the drip pan 138. In the present embodiment, the cooling plate 134 is cooled by ambient air. However, it is conceivable for active cooling elements, for example a heat exchanger or an energizable cooling element, to be provided in the region of the cooling plate 134 in order to achieve a greater cooling performance.

The removable and emptyable drip pan 138 is in particular designed to be transparent to light, so that the fill level of the drip pan 138 can be checked visually.

On the side facing away from the front wall 130 and facing the rear wall 132, the entry channel 125 opens into a filter region 140. A filter element 142 is provided in the filter region 140. As is also clear in particular from FIGS. 5 and 6, the filter element 142, which can for example be provided with a filter grate with a filter fleece, runs obliquely to the horizontal 137 and is formed declining towards the rear wall 132. Thereby, the filter element 142 is located on a diagonal of the drawer 126. Overall, the plane in which the cooling plate 134 is located and the plane formed by the filter element 142 encloses an acute angle 144.

The drawer 126 has a shielding plate 146 in the rear region above the filter element 142. As is clear from FIG. 5, the shielding plate 146 is provided between the intake region 109 of the fan impeller 106 and the filter element 142 and consequently shields the intake region 109 of the fan impeller 106. The shielding plate 146 shields in particular the region of the filter element 142 that is located close to the bottom 128 of the drawer 126. By providing the shielding plate 146, the entire upper side of the drawer 126 is consequently not opened; rather, only the region that is not covered by the shielding plate 146 is opened. As a result, a favorable air deflection is brought about and moreover a more uniform conduction of the process gas through the filter element 142.

In order to cause the process gas that is passing through the filter element 142 to be guided towards the intake region of the respective fan unit 100, a guide plate 148 is provided on the base body 60.

FIG. 5 and FIG. 6 show the drawer 126 in a slightly vertically lowered state. To raise the drawer 126, a lowering mechanism 150 with a lever mechanism, which can be operated by means of a manually operable rod 152 with which the drawer 126 can be adjusted between a lowering position and a raising position, is used. In particular, it is conceivable for the lowering mechanism 150 and the drawer 126 to be provided behind a door provided on the front side of the base body 60, so that the lowering mechanism 150 and the drawer 126 are accessible after the door is opened. After the drawer 126 has been lowered, it can, as shown in FIG. 6, be pulled out transversely to the transport direction 18, in a horizontally extending direction 154. For this purpose, FIG. 6 shows a horizontal guide 156 in the form of a guide rail for the drawer 126.

Of course, it is also conceivable for the lowering mechanism 150 to be operated in an automated manner, for example electrically or pneumatically.

In the base body 60, a collecting tray 155 is provided underneath the drawer 126, the collecting tray being used to collect condensate dripping down when the drawer 126 is open or contaminants dropping down.

Figure 7:
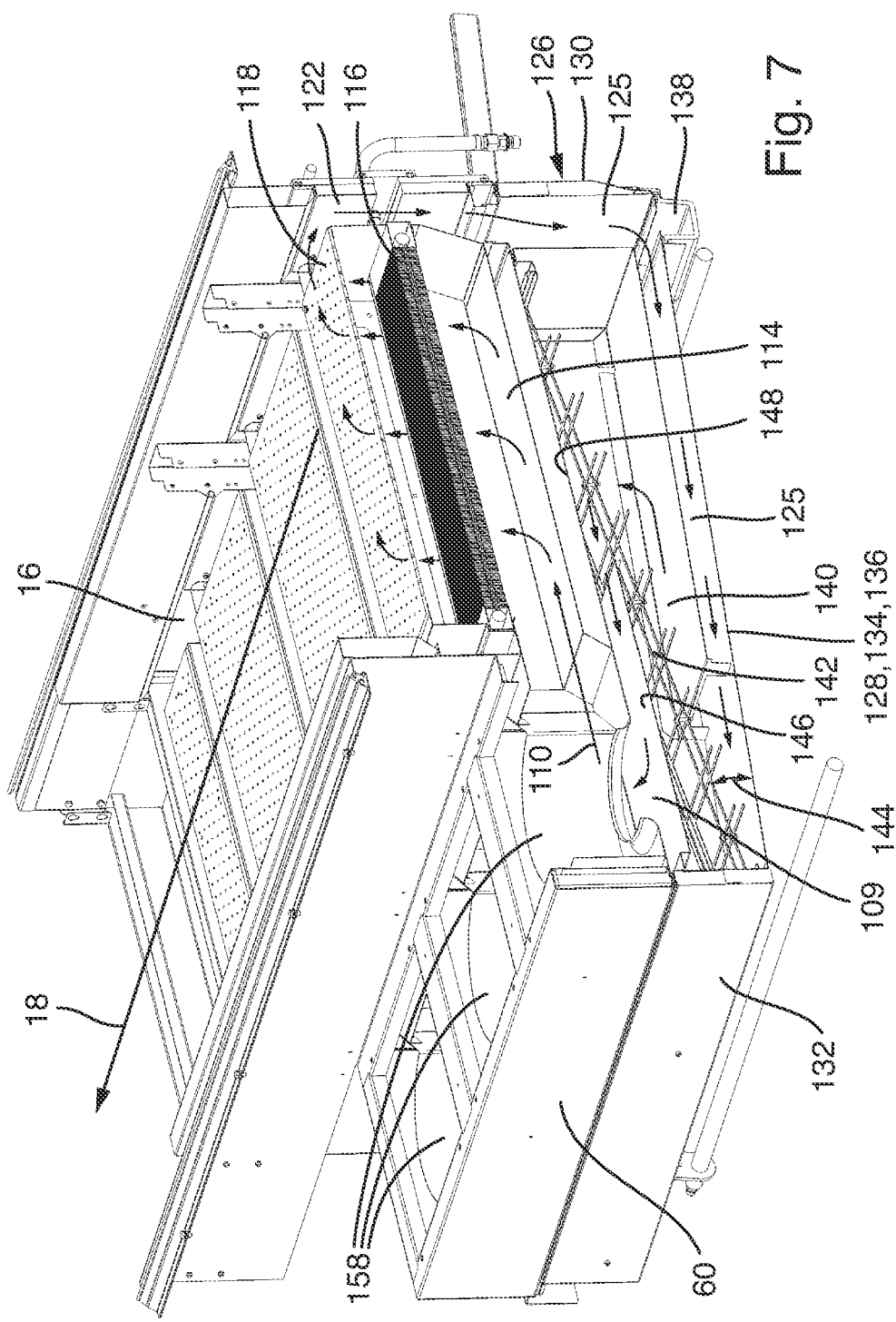
FIG. 7 a detail of the base body of the reflow soldering apparatus with drawer according to FIGS. 6 and 7 in an exploded representation.

FIG. 7 shows three fan receptacles 158 for receiving fan units 100, which are not shown here. The fan receptacles 158 are provided laterally adjacent to the process channel 16 and spaced apart in the horizontal direction to the process channel 16, namely in such a way that fan units 100 that are inserted into the fan receptacles 158 are arranged along a line running parallel to the transport direction 18. The rotor shafts 104 of these fan units 100 are then arranged running parallel to one another.

Figure 8:
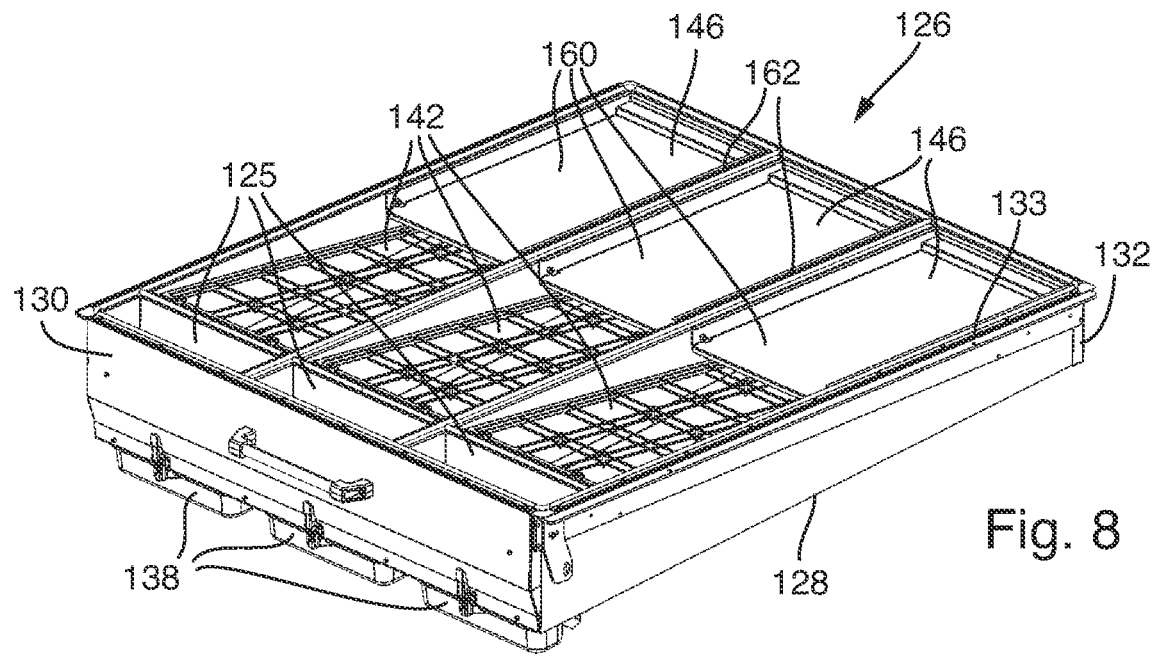
FIG. 8 a drawer of the reflow soldering apparatus according to FIGS. 6 and 7.
Figure 9:
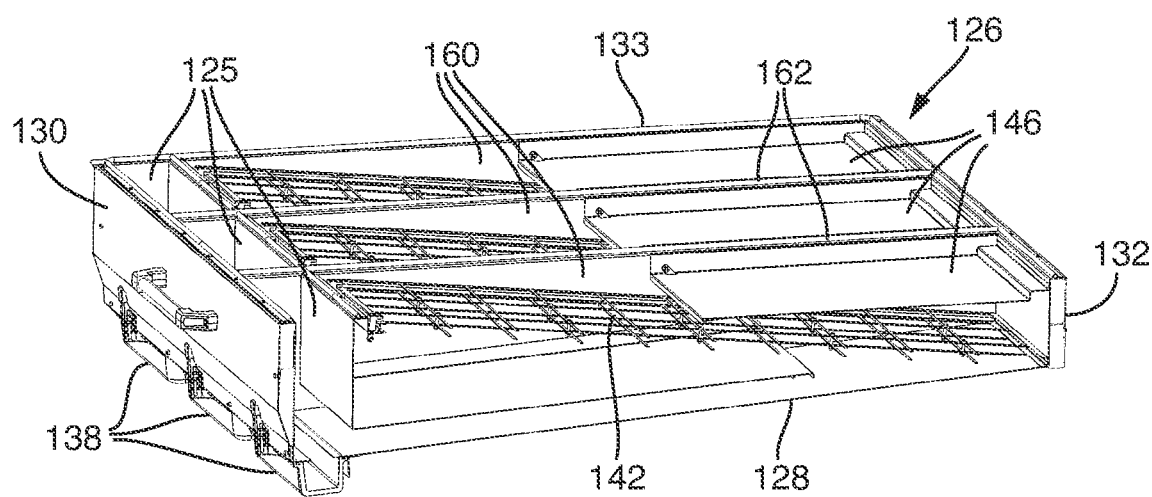
FIG. 9 a longitudinal section through the drawer according to FIG. 8.

With the fan units 100 to be provided in the three fan receptacles 158, a total of three air circuits running transversely to the process direction 118 are provided, wherein the drawer 126, as shown in FIGS. 8 and 9, has three compartments 160 that lie next to one another in the pull-out direction 154. The adjacent compartments 160 are separated by component walls 162. Each of the compartments 160 in the drawer 126 has its own entry channel 125, its own filter element 142 and its own shielding plate 146. Consequently, a total of three air circuits separated from one another are provided in the drawer 126, wherein each air circuit is provided by means of a fan unit 100, which is provided in the respective fan receptacle 158.

The respective circuit of the process gas is again clearly apparent from the representation according to FIG. 7. In total, 3 air circuits are provided, which run substantially transversely to the transport direction 18. The air circuit provided by the respective fan unit 100 is such that, via the respective fan unit 100, process gas 110 is first blown laterally into the guide channel 114 below the process channel and then deflected upwards. The process gas then passes through the heat exchanger 116 before it reaches the process channel 16 through the nozzle plate 118. The material for soldering is then preferably flowed onto from below over the entire length of the cooling zone 24 and cooled. The process gas is extracted from the process channel, specifically via the feed duct 122 provided on the front side, which opens into the respective entry channel 125 of the drawer 126. The process gas then flows along the bottom 128 or the cooling plate 134 into the respective filter region 140. Condensate contained in the process gas condenses on the cooling plate 134 and collects in the drip pan 138, which can preferably be emptied without opening the drawer 126. The process gas then flows through the respective filter element 142, is deflected at the underside of the respective shielding plate 146 and is guided further over the upper side of the respective shielding plate 146 towards the respective fan unit 100. Overall, it is thereby achieved that all process gas that flows back into the process channel passes the filter element 142 and is thus cleaned.

As is clear from FIGS. 8 and 9, the respective shielding plates 146 extend from the rear wall 132 towards the front wall 130 such that they cover approximately half the filter element 142. In FIGS. 8 and 9, the filter element 142 is formed by a wire mesh shown in FIG. 8, in which a filter fleece (not shown), which can be replaced in a simple manner, is formed.

What is claimed is:

1. A soldering apparatus for performing continuous soldering of printed circuit boards along a transport direction, comprising a process channel with a preheating zone, a soldering zone and a cooling zone, comprising a base body and a cover hood, wherein the cover hood can be displaced between a closed position and an open position, wherein nozzle plates, fan units with fan motors, air ducts conducting a process gas, at least one of filter elements and cooling elements are provided in the base body, characterized in that a drawer, which extends along a pull-out direction running transversely to the transport direction, is provided in the base body, said drawer having a bottom, a front wall and a rear side, wherein air ducts for conducting the process gas, an at least one replaceable filter element provided in a filter region and/or an at least one cooling device are provided in the drawer.

2. The soldering apparatus according to claim 1, characterized in that air ducts are formed and arranged in the base body in such a way that the process gas is conducted out of the process channel vertically downwards into an entry channel provided on the front wall of the drawer, wherein the entry channel is deflected in a region of the base of the drawer towards a cooling device comprising a cooling plate.

3. The soldering apparatus according to claim 2, characterized in that the entry channel opens into the filter region on a side facing the rear side and in which the at least one filter element is provided.

4. The soldering apparatus according to claim 1, characterized in that an at least one shielding plate is provided in an upper region of the drawer, wherein the shielding plate shields an intake region of at least one fan unit towards the filter region.

5. The soldering apparatus according to claim 1, characterized in that the cooling plate extends along a cooling plane running obliquely to the horizontal and that a drip pan is provided in or on the bottom of the drawer in a region of the front wall.

6. The soldering apparatus according to claim 1, characterized in that the at least one filter element is arranged in the drawer obliquely to the horizontal and/or in the region of a diagonal of the drawer.

7. The soldering apparatus according to claim 4, characterized in that at least one the shielding plate covers the part of the filter element, which is located suggested to the bottom of the drawer.

8. The soldering apparatus according to claim 5, characterized in that the cooling plane and the filter plane form an acute angle.

9. The soldering apparatus according to claim 1, characterized in that the drawer has at least two compartments lying next to one another in the pull-out direction, wherein the at least one filter element is provided in each of the compartments.

10. The soldering apparatus according to claim 1, characterized in that the base body has a collecting tray underneath the drawer.

11. The soldering apparatus according to claim 1, characterized in that a lowering mechanism is provided for lowering the drawer before the drawer is pulled out or as the drawer is being pulled out.

12. The soldering apparatus according to claim 1, characterized in that, in or on the base body, at least one fan unit located on a face of the rear side facing away from the front wall, lying in the pull-out direction behind the rear side is provided.

13. The soldering apparatus according to claim 12, characterized in that air ducts are provided in such a way that, during operation of the at least one fan unit, process gas is blown into the process channel, that, after passage through the process channel, the process gas is conducted through the at least one filter element provided in a filter region after the process channel and that the filtered process gas is sucked in by the at least one fan unit.

14. The soldering apparatus according to claim 13, characterized in that, during operation of the at least one fan unit, process gas is blown into the process channel in such a way that the material for soldering is blown at from below.

* * * * *